United States Patent
Chun et al.

(10) Patent No.: US 8,128,773 B2
(45) Date of Patent: Mar. 6, 2012

(54) PRESSURE SENSITIVE ADHESIVE FOR TRANSPORTING FLEXIBLE SUBSTRATE

(75) Inventors: Sang-ki Chun, Daejeon (KR); Dong-han Kho, Daegu (KR); Suk-Ky Chang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 356 days.

(21) Appl. No.: 12/087,919

(22) PCT Filed: Jan. 15, 2007

(86) PCT No.: PCT/KR2007/000248
§ 371 (c)(1),
(2), (4) Date: Nov. 24, 2008

(87) PCT Pub. No.: WO2007/083906
PCT Pub. Date: Jul. 26, 2007

(65) Prior Publication Data
US 2010/0059171 A1    Mar. 11, 2010

(30) Foreign Application Priority Data
Jan. 18, 2006   (KR) .................. 10-2006-0005297

(51) Int. Cl.
| | |
|---|---|
| *B32B 7/12* | (2006.01) |
| *B32B 7/02* | (2006.01) |
| *B32B 5/02* | (2006.01) |
| *B32B 37/00* | (2006.01) |
| *C08G 77/38* | (2006.01) |

(52) U.S. Cl. ........ 156/230; 428/352; 428/212; 428/141; 525/478

(58) Field of Classification Search ................ 156/230; 428/352, 212, 141; 525/475, 478
See application file for complete search history.

(56) References Cited

U.S. PATENT DOCUMENTS

| | | | | |
|---|---|---|---|---|
| 4,774,297 | A | * | 9/1988 | Murakami et al. ........... 525/478 |
| 5,164,461 | A | * | 11/1992 | Mitchell et al. .............. 525/478 |
| 5,190,827 | A | * | 3/1993 | Lin ................ 428/447 |
| 5,248,739 | A | * | 9/1993 | Schmidt et al. .............. 525/477 |
| 5,602,214 | A | * | 2/1997 | Lin et al. ....................... 525/478 |
| 5,977,226 | A | * | 11/1999 | Dent et al. ..................... 524/267 |
| 6,057,405 | A | * | 5/2000 | Wengrovius et al. ......... 525/477 |
| 6,124,407 | A | * | 9/2000 | Lee et al. ....................... 525/478 |
| 6,703,120 | B1 | * | 3/2004 | Ko et al. ................... 428/355 R |
| 6,784,555 | B2 | * | 8/2004 | Watson ........................ 257/783 |
| 6,875,795 | B2 | | 4/2005 | Irifune |

(Continued)

FOREIGN PATENT DOCUMENTS

EP    1312659 A1    5/2003

(Continued)

*Primary Examiner* — Robert Loewe
(74) *Attorney, Agent, or Firm* — McKenna Long & Aldridge LLP (57) ABSTRACT

Disclosed herein is a silicon adhesive composition for transporting a flexible substrate. The composition includes (A) 42 to 70 parts by weight of a polydiorganosiloxane containing an alkenyl group, (B) 55 to 28 parts by weight of a polyorganosiloxane copolymer including $R^1_3SiO_{1/2}$ units and $SiO_2$ units, wherein $R^1$ is a hydroxy group or a monovalent hydrocarbon group of 1 to 12 carbon atoms, (C) a polyorganosiloxane containing an SiH group, wherein the molar ratio of the SiH group of component (C) to the alkenyl group of component (A) is from 0.5 to 20, and (D) a platinum group catalytic compound, wherein the weight ratio of a metal component of the compound to the sum of components (A) and (B) is from 1 to 5000 ppm by weight.

18 Claims, 3 Drawing Sheets

U.S. PATENT DOCUMENTS

| | | | |
|---|---|---|---|
| 7,049,375 B2 * | 5/2006 | Meguriya | 525/477 |
| 2003/0114560 A1 * | 6/2003 | Yang et al. | 524/154 |
| 2005/0038183 A1 * | 2/2005 | Ahn et al. | 524/861 |
| 2005/0038188 A1 * | 2/2005 | Ahn et al. | 525/102 |
| 2005/0271884 A1 * | 12/2005 | Ahn et al. | 428/446 |
| 2005/0282959 A1 * | 12/2005 | Ahn et al. | 524/861 |

FOREIGN PATENT DOCUMENTS

| | | |
|---|---|---|
| JP | 8-53156 | 2/1996 |
| JP | 2000-178449 | 6/2000 |
| JP | 2000-252342 | 9/2000 |
| JP | 2000-261193 | 9/2000 |
| JP | 2001-279224 | 10/2001 |
| JP | 2002-258252 | 9/2002 |
| JP | 2002-314240 | 10/2002 |
| JP | 2003-273493 | 9/2003 |
| JP | 2004-196956 | 7/2004 |
| JP | 2005-298550 | 10/2005 |
| JP | 2006-225420 | 8/2006 |

* cited by examiner

PRESSURE SENSITIVE ADHESIVE FOR TRANSPORTING FLEXIBLE SUBSTRATE

This application claims the benefit of International Application Number PCT/KR/2007/000248 filed on Jan. 15, 2007 and Korean Application No. 10-2006-0005297 filed on Jan. 18, 2006, both of which are hereby incorporated by reference as if fully set forth herein.

TECHNICAL FIELD

The present invention relates to an adhesive for transporting a flexible substrate, which can be used for applying a flexible substrate such as a plastic substrate to a process of manufacturing a display, and a method of transporting a flexible substrate using the adhesive.

BACKGROUND ART

Recently, according to the trend toward the use of light parts and thin parts in the field of display and electronic industries, research on a flexible base material, particularly, a plastic substrate, has been actively conducted. When a substrate is fabricated using plastic, which is a thin, light and flexible material, the substrate has advantages such as high durability, low price and a simple fabrication process. It is expected that a display manufactured using a flexible substrate including this plastic substrate can be implemented as a paper-like display through a flexible display or a rollable display, in the development of the display industry.

However, since a flexible substrate, particularly a plastic substrate, which will replace a glass substrate used to manufacture a Liquid Crystal Display (LCD) panel or an Organic Light Emitting Display (OLED) panel, is flexible, there is a problem in that it is difficult to transport the substrate in a process of manufacturing a panel using the glass substrate.

To overcome this problem, a method of attaching the flexible substrate to a transporting support formed of a relatively thick plate glass or plastic plate, transporting it during a manufacturing process, and finally detaching it from the support has been commonly known. This method includes attaching a plastic substrate for a liquid crystal display device to a thick plate glass or plastic plate, which is a flat transporting support, performing resist-forming, etching and cleaning processes directly using a process and apparatus for manufacturing a liquid crystal display device using the commonly used glass substrate, and finally separating the plastic substrate from the support.

A double-sided adhesive tape, one side of which has a low adhesive strength and the other side of which has a relatively high adhesive strength, or a release sheet, the adhesive strength of which is easily controlled by temperature or light, has been proposed as a general adhesive for use in the above method. When this adhesive is used, there are advantages in that panel manufacturing lines using the commonly used glass substrate can be directly used without alteration, so that the investment cost of equipment for manufacturing a panel using the flexible substrate is minimized, with the result that the panel can be manufactured at low cost. Technologies related thereto are as follows.

Japanese Unexamined Patent Publication Nos. Heisei08-53156, 2000-252342 and 2002-258252 disclose temperature sensitive adhesives which have high adhesive strength at the time of the transport and processing of electronic parts and facilitate the peeling of the electronic parts due to the decrease of adhesive strength after the transport and processing thereof.

Specifically, Japanese Unexamined Patent Publication No. Heisei08-53156 relates to an adhesive using a (meth)acrylic acid polymer having side-chain crystallinity, in which the carbon number of an ester is 8 or more. This cold-peelable adhesive has an adhesive strength ranging from 100 to 800 N/m (250 to 2000 g$_f$/25 mm) at a temperature not lower than the melting point, and has an adhesive strength of 100 N/m (250 g$_f$/25 mm) or less at a temperature not higher than the melting point. Therefore, a substrate cannot be detached in a high-temperature process, but can be easily detached at a temperature not higher than the melting point (−10° C.). However, since the adhesive is an adhesive containing an acrylic resin as a principal component, the property of the adhesive is easily changed, the chemical resistance thereof is decreased, and bubbles are generated at a temperature of 150° C. or more in a Thin Film Transistor (TFT) process and/or a color filter process, which are substrate manufacturing processes for manufacturing an LCD panel or an OLED panel, therefore there is a problem in that a lithography process cannot be performed due to the low dimensional stability of flexible substrate.

Japanese Unexamined Patent Publication No. 2000-252342 discloses a method of applying a double-sided adhesive tape one side of which is coated with a warm-peelable adhesive and the other side of which is coated with an adhesive for bonding a support plate, like a conventional adhesive. The warm-peelable adhesive has an advantage in that, when the warm-peelable adhesive is heated at a temperature of 100° C. for 1 minute, the adhesion area is decreased due to foaming, so that the adhesive strength is decreased, thereby the peeling-off adhesive is easily peeled off from the flexible substrate. However, as described above, there has been a problem in that the warm-peelable adhesive cannot be applied to a process of manufacturing an LCD panel or an OLED panel at high temperatures due to foaming at temperatures of 100° C. or higher.

Japanese Unexamined Patent Publication No. 2002-258252 discloses a method of using a temperature sensitive adhesive the adhesive strength of which varies according to a reversible change between a crystal state and an amorphous state. However, since this adhesive is also an acrylic adhesive, there are the same problems as before, that is, low heat resistance, low chemical resistance, partial foaming or partial peeling at high temperatures.

Meanwhile, Japanese Unexamined Patent Publication No. Heisei08-086993 discloses a jig for transporting a flexible substrate, which is provided with a support that includes a tacky adhesive layer. That is, disclosed is a method of decreasing stress by forming an adhesive layer or an intermediate layer between the support of the jig and the tacky adhesive layer to prevent bubbles or peeling between the substrate and the tacky adhesive layer resulting from the stress generated by the difference in the thermal expansion coefficients. This method has an advantage in that the adhesive strength between the support and the tacky adhesive layer is increased due to the adhesive layer, thereby enabling easy removal of the flexible substrate in the final process. Although it is described in this patent document that a silicon rubber having better heat-resistance than that of an acrylic resin is used as the tacky adhesive, and a jig provided with a tacky adhesive can be used several times, there have been problems in that, after the tacky adhesive has been used several times, the adhesive strength of the tacky adhesive is decreased because extraneous materials adhere to the surface of the tacky adhesive, and the removal of an adhesive to reuse the support cannot be easily conducted.

Accordingly, a disposable adhesive for transporting a flexible substrate, which has advantages in that bubbles and partial peeling do not occur, that is, heat resistance, chemical resistance and dimensional stability are excellent even in a high temperature process or an acid and base process, such as a resist forming process, an etching process and a cleaning process, which are processes for manufacturing an LCD panel or an OLED panel comprising a flexible substrate, particularly, a plastic substrate, by directly utilizing conventional panel manufacturing apparatuses and processes using a glass substrate, the flexible substrate is easily detached, and the adhesive is easily removed from the glass substrate, which functions as a support, is keenly required.

DISCLOSURE

Technical Problem

Accordingly, the present invention has been made to solve the above problems of the prior art, and an object of the present invention is to provide a silicon adhesive composition for transporting a flexible substrate, in which conventional apparatuses and processes for manufacturing a liquid crystal display device using a glass substrate can be directly utilized without modification, dimensional stability due to bubble formation or partial peeling from a flexible substrate is not deteriorated in etching and cleaning processes, heat resistance at a temperature of 200° C. for 24 hours, chemical resistance in acid and base conditions are excellent, a flexible substrate fixed on a support after a final process can be easily detached therefrom, light transmissivity for alignment marks, necessary in order to form electrode patterns on the flexible substrate, is high, and the adhesive can be easily removed from glass, which is a support for transport, for reuse thereof.

Another object of the present invention is to provide an adhesive sheet containing the silicon adhesive composition.

A further object of the present invention is to provide a method of transporting a flexible substrate using the silicon adhesive or the adhesive sheet.

Technical Solution

In order to accomplish the above object, the present invention provides a disposable silicon adhesive composition for transporting a flexible substrate, which can be used for applying a flexible substrate such as a plastic substrate instead of a glass substrate to a process of manufacturing an LCD or an OLED, an adhesive sheet containing the composition, and a method of transporting a flexible substrate using the composition and the sheet.

Specifically, the present invention provides a silicon adhesive composition for transporting a flexible substrate, including (A) 42 to 70 parts by weight of a polydiorganosiloxane containing an alkenyl group, (B) 55 to 28 parts by weight of a polyorganosiloxane copolymer including $R^1{}_3SiO_{1/2}$ units and $SiO_2$ units, wherein $R^1$ is a hydroxy group or a monovalent hydrocarbon group of 1 to 12 carbon atoms, (C) a polyorganosiloxane containing an SiH group, wherein the molar ratio of the SiH group of component (C) to the alkenyl group of component (A) is from 0.5 to 20, and (D) a platinum group catalytic compound, wherein the weight ratio of a metal component of the compound to the sum of components (A) and (B) is from 1 to 5000 ppm by weight.

Further, the present invention provides an adhesive sheet including the silicon adhesive composition for transporting a flexible substrate.

Further, the present invention provides a method of transporting a flexible substrate, including the steps of (a) forming an adhesive layer on a flexible substrate or a support, (b) attaching the flexible substrate and the support, one of which is provided with the adhesive layer, to each other and then transporting the flexible substrate and the support, and (c) separating the flexible substrate from the adhesive layer and the support, wherein the adhesive layer includes the silicon adhesive composition for transporting a flexible substrate.

Advantageous Effects

The silicon adhesive composition according to the present invention has heat resistance, chemical resistance, close adhesion to base material, and transparency, and enables easy substrate detachability, all of which are necessary for an adhesive for transporting a flexible substrate. Flexible displays using a flexible substrate such as a plastic substrate can be manufactured using a process and apparatus for manufacturing a liquid crystal display device using a glass substrate and the silicon adhesive composition of the present invention.

BEST MODE

Hereinafter, the present invention will be described in detail.

For the silicon adhesive composition of the present invention, the contents of (A) a polydiorganosiloxane containing an alkenyl group and (B) a polyorganosiloxane copolymer including $R^1{}_3SiO_{1/2}$ units and $SiO_2$ units, wherein $R^1$ is a hydroxy group or a monovalent hydrocarbon group of 1 to 12 carbon atoms, are adjusted to provide the most suitable adhesive strength for transporting a flexible substrate. The weight ratio of the component (A) to the component (B) was adjusted from 1:0.4 to 1:1.3, the composition was heated at a temperature of 200° C. for 1 hour and was then left at room temperature for 1 hour, and then the peel adhesive strength of the composition was measured at a peel rate of 300 mm/min and a peel angle of 180° using a tension testing device. The measured peel adhesive strength was from 10 to 300 gf/25 mm.

When the weight ratio is below 1:0.4, workability of peeling a plastic substrate from an adhesive layer is improved, but a substrate is not stably transported because bubbles are formed on an adhesive face, washing liquid infiltrates into the adhesive face, and the substrate is peeled from a support depending on the process conditions for transporting the flexible substrate, such as heating temperature and cleaning conditions.

When the weight ratio is above 1:1.3, process stability is excellent because the plastic substrate is fixed to the support, but the plastic substrate is cracked and deformed, or a silicon adhesive adheres to the plastic substrate at the time of peeling, because the plastic substrate is not easily peeled from the support after processes are completed.

The weight ratio of the component (A) to the component (B) is preferably from 1:0.4 to 1:1, more preferably from 1:0.5 to 1:0.95, still more preferably from 1:0.7 to 1:0.93, and most preferably from 1:0.8 to 1:0.92.

Each component of the silicon adhesive composition according to the present invention is concretely described below.

It is preferred that polydiorganosiloxane (A) containing the alkenyl group of the present invention has the following Formula (1):

wherein $R^2$ is a monovalent hydrocarbon group of 1 to 12 carbon atoms, which does not include an aliphatic unsaturated linkage, Xs may be identical or different, and each is an organic group containing an alkenyl group of 1 to 12 carbon atoms or a hydroxy group, provided that every X is not a hydroxy group, m is a number greater than or equal to 0, n is a number greater than or equal to 100, a is an integer number ranging from 0 to 3 in the case where X represents an alkenyl group, a is 1 in the case where X represents a hydroxy group, and a and m are not both 0.

In Formula (1), it is preferred that $R^2$ be one or more selected from the group consisting of a straight-chain or side-chain alkyl group of 1 to 6 carbon atoms, a cycloalkyl group of 3 to 8 carbon atoms, and an aryl group of 6 to 10 carbon atoms, which is unsubstituted or substituted with the straight-chain or side-chain alkyl group of 1 to 6 carbon atoms. It is more preferred that $R^2$ be one or more selected from the group consisting of a methyl group, an ethyl group, a propyl group, a butyl group, a cyclohexyl group, a phenyl group and a tolyl group.

Further, it is preferred that the organic group X containing an alkenyl group be one or more selected from the group consisting of a vinyl group, an allyl group, a hexenyl group, an octenyl group, an acryloyl propyl group, an acryloyl methyl group, a methacryloyl propyl group, a cyclohexenyl ethyl group and a vinyloxy propyl group.

It is preferred that the molar ratio of $R^1_3SiO_{1/2}$ units (M units) to $SiO_2$ units (Q units) in the polyorganosiloxane copolymer (B) be from 0.6 to 1.7. adhesive strength and retentivity can be realized within that molar ratio.

It is preferred that $R^1$ be one or more selected from the group consisting of a straight-chain or side-chain alkyl group of 1 to 6 carbon atoms, a cycloalkyl group of 3 to 8 carbon atoms, and an aryl group of 6 to 10 carbon atoms, which is unsubstituted or substituted with a straight-chain or side-chain alkyl group of 1 to 6 carbon atoms. It is more preferred that $R^1$ be one or more selected from the group consisting of a methyl group, an ethyl group, a propyl group, a butyl group, a cyclohexyl group, a phenyl group and a tolyl group.

It is preferred that the content of SiOH unit be 4 parts or less by weight to the total weight parts of polyorganosiloxane copolymer (B), and $R^1$ may be a hydroxy group in the polyorganosiloxane copolymer (B). When the content of SiOH unit is above 4 parts, the adhesive strength of the adhesive is decreased. Further, the component (B) may contain $R^1_3SiO_{3/4}$ units and $R^1_2SiO$ units as long as the characteristics of the present invention are not impaired. Two or more of the component (B) may be used in combination.

Meanwhile, the components (A) and (B) may be used by simply mixing them, and condensation products of the components (A) and (B) may be used when the component (A) contains SiOH, wherein X of the component (A) is a hydroxy group. The condensation of the components (A) and (B) is performed by dissolving the components (A) and (B) in a solvent such as toluene and reacting them at room temperature or in a reflux condition by using alkali catalyst. The mixed ratio of the component (A) to the component (B) is, for example, from 45/55 to 70/30, and preferably from 50/50 to 65/35.

It is preferred that the straight-chain, branched-chain or cyclic polyorganosiloxane (C) containing an SiH group of the present invention have the following Formula (2) or Formula (3), wherein the polyorganosiloxane (C) is a crosslinking agent, and that the number of hydrogen atoms combined with silicon atoms in a molecule is preferably 2 or more, and more preferably 3 or more:

wherein each $R^3$ and $R^4$ is independently a monovalent hydrocarbon group of 1 to 12 carbon atoms, respectively, b is 0 or 1, p and q are arbitrary integer numbers, s is an integer number greater than or equal to 2, t is an integer number greater than or equal to 0, and s+t≧3, and each p+q and s+t has value such that the viscosity of Formula (2) or Formula (3), respectively, is from 1 to 5000 mPas at 25° C.

In Formulas (2) and (3), it is preferred that $R^3$ and $R^4$ be one or more selected from the group consisting of a straight-chain or side-chain alkyl group of 1 to 6 carbon atoms, a cycloalkyl group of 3 to 8 carbon atoms, and an aryl group of 6 to 10 carbon atoms, which is unsubstituted or substituted with the straight-chain or side-chain alkyl group of 1 to 6. It is more preferred that $R^3$ and $R^4$ be one or more selected from the group consisting of a methyl group, an ethyl group, a propyl group, a butyl group, a cyclohexyl group, a phenyl group and a tolyl group.

It is preferred that the component (C) be combined such that the molar ratio of SiH group of the component (C) to the alkenyl group of the component (A) be from 0.5 to 20, particularly from 1 to 15. When the molar ratio is below 0.5, retentivity is decreased due to low crosslinking density. When the molar ratio is above 20, adhesive strength is not realized due to high crosslinking density.

The platinum group catalytic compound (D) according to the present invention is used to cure components (A) and (B) by facilitating an addition reaction therebetween. It is preferred that the component (D) be one or more selected from the group consisting of platinum black, chloroplatinic acid, chloroplatinic acid-olefin complex, chloroplatinic acid-alcohol coordination compound, rhodium, and rhodium-olefin complex. It is preferred that the weight ratio of the compound (D) to the weight sum of the components (A) and (B) be from 1 to 5000 ppm, and particularly from 5 to 2500 ppm by weight. When the weight ratio is below 1 ppm, retentivity is decreased because curability is decreased and crosslinking density is lowered. When the molar ratio is above 5000 ppm, shelf life is short because the reactivity and curing rate are increased.

It is preferred that the silicon adhesive composition according to the present invention further include an organic solvent in order to adjust the storage stability, coating properties, and viscosity of the adhesive. The content of the organic solvent is preferably 50 to 200 parts by weight to the weight of sum components (A) and (B), but is not limited thereto. It is preferred that the organic solvent be one or more selected from the group consisting of toluene, xylene, ethylacetate, acetone, methylethylketone and hexane. More preferably, toluene and/or xylene may be used as the organic solvent.

It is preferred that the silicon adhesive composition according to the present invention further include a silane-based coupling agent of 3 to 10 parts by weight based on 100 parts by weight of component (A). It is preferred that the silane-based coupling agent be one or more selected from the group consisting of γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, γ-methacryloxypropyltrimethoxysilane, γ-methacryloxypropyltriethoxysilane, γ-aminopropyltriethoxysilane, 3-isocyanatepropyltriethoxysilane, γ-acetoacetate propyltrimethoxysilane. Further, the silane-based coupling agent may be used by selecting one or mixing two or more.

The silicon adhesive composition according to the present invention may further include arbitrary components other than the above components. For example, unreactive polyorganosiloxane such as polydimethylsiloxane or polydimethyldiphenylsiloxane; oxidation inhibitor such as phenolic, quinone, amine, phosphorus, phosphate, sulfuric or thioether; light stabilizer such as triazole or benzophenone; fire retardant such as phosphoric ester, halogen, phosphorus or antimony; antistatic agent such as cationic active agent, anionic active agent or nonionic active agent; toning agent; adjuvant; filler; antifoaming agent; surfactant; plasticizer; inorganic filler such as silica; or an additive such as a pigment may be additionally used.

The present invention relates to an adhesive sheet containing the above silicon adhesive composition. The adhesive sheet may include an adhesive layer in which the silicon adhesive composition is applied on a release film. Particularly, the adhesive layer may include a multi-layered structure coated with two or more adhesive compositions having different adhesive strength. It is preferred that the surface tension of the release film be from 10 to 30 mN/m, and that the surface roughness thereof be 0.2 μm or less. The release film is easily detached within this numerical range.

Further, the present invention relates to a method of transporting a flexible substrate, including the steps of (a) forming an adhesive layer on a flexible substrate or a support; (b) attaching the flexible substrate and the support, one of which is provided with the adhesive layer, to each other, and then transporting the flexible substrate and the support; and (c) separating the flexible substrate from the adhesive layer and the support, wherein the adhesive layer includes the silicon adhesive composition, including (A) 45 to 70 parts by weight of polydiorganosiloxane containing an alkenyl group, (B) 55 to 30 parts by weight of a polyorganosiloxane copolymer including $R^1{}_3SiO_{1/2}$ units and $SiO_2$ units, wherein $R^1$ is a hydroxy group or a monovalent hydrocarbon group of 1 to 12 carbon atoms, (C) a polyorganosiloxane containing an SiH group, wherein the molar ratio of the SiH group of the component (C) to the alkenyl group of the component (A) is from 0.5 to 20, and (D) a platinum group catalytic compound, wherein the weight ratio of a metal component of the compound to the sum of the components (A) and (B) is from 1 to 5000 ppm by weight.

It is preferred that the flexible substrate be one or more selected from the group consisting of a metal foil including an aluminum foil or a copper foil; and a plastic substrate including polyester, polytetrafluoroethylene, polyimide, polyphenylene sulfide, polyamide, polycarbonate, polystyrene, polypropylene, polyethylene, polyvinylchloride, polyethersulfone (PES) or polyethylenenaphthalene (PEN).

The thickness of the adhesive layer is not particularly limited, and may be adjusted if necessary, but is preferably from 1 to 200 μm.

In the step (a) of forming an adhesive layer on a flexible substrate or a support, various commonly known methods may be used without limitation, but preferably, the adhesive layer is formed by applying an adhesive composition on the flexible substrate or the support using a coater. The coater may be selected from the group consisting of a bar coater, a roll coater, a reverse coater, a gravure coater and an air-knife coater.

Further, the step (a) may include (d) forming an adhesive sheet by applying at least one adhesive composition on a release film, and (e) forming an adhesive layer by transferring the adhesive sheet to the flexible substrate or the support.

In the step (a) of forming an adhesive layer on a flexible substrate or a support, it is preferred that the amount of the applied adhesive composition be from 0.1 to 200 g/m².

The method of transporting a flexible substrate according to the present invention may further include the step of heating the adhesive layer at a temperature of 80 to 200° C. for 10 to 300 sec between the step (a) and the step (b).

In the step (c), the peel adhesive strength of the adhesive layer to the support or the flexible substrate is preferably from 10 to 300 gf/25 mm, more preferably from 20 to 200 gf/25 mm, and most preferably from 30 to 120 gf/25 mm. In particular, it is preferred that the peel adhesive strength of the adhesive layer to the support be higher than that of the adhesive layer to the flexible substrate.

The method of transporting a flexible substrate according to the present invention, which is the step of removing an adhesive layer applied on a support, may further include (f) removing the adhesive layer from the support coated with the residual adhesive layer using one or more organic solvent selected from the group consisting of acetone and toluene; or (g) transferring an adhesive tape to an upper portion of the support coated with the residual adhesive layer and (h) separating the adhesive layer and the adhesive tape from the support after the step (c).

It is preferred that the adhesive strength of the adhesive tape used to separate the adhesive layer be 500 gf/25 mm or more.

Mode for Invention

Hereinafter, processes of transporting a flexible substrate using the above adhesive composition will be described in detail with reference to the accompanying drawings.

First, a process of transporting a flexible substrate according to a first embodiment of the present invention will be described in detail.

FIGS. 1 to 4 are sectional views showing a process of transporting a flexible substrate according to a first embodiment of the present invention.

Figure 1:
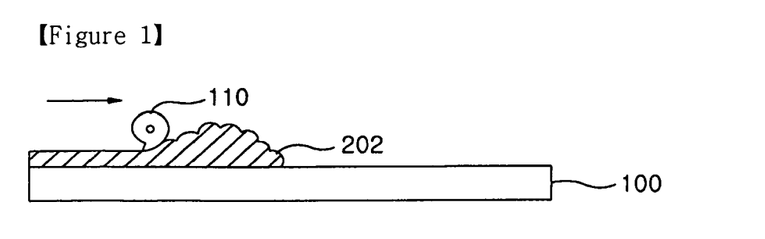
FIGS. 1 to 4 are sectional views showing a process of transporting a flexible substrate according to a first embodiment of the present invention.

Referring to FIG. 1, a predetermined amount of adhesive composition 202 is placed on a flexible substrate 100, and then the adhesive composition 202 is spread on the flexible substrate 100 using a coater 110 at a constant rate. A commonly known coater in the related art, such as a bar coater, a roll coater, a reverse coater, a gravure coater or an air-knife coater, may be used as the coater 110.

Further, a plastic film such as polyester, polytetrafluoroethylene, polyimide, polyphenylene sulfide, polyamide, polycarbonate, polystyrene, polypropylene, polyethylene, polyvinylchloride, polyethersulfone (PES) and polyethylenenaphthalene (PEN), or a metal foil such as aluminum foil and copper foil may be used as the flexible substrate 100.

Figure 2:
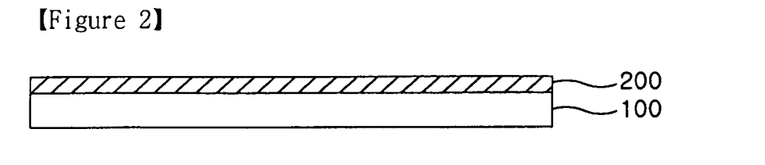
Figure 3:
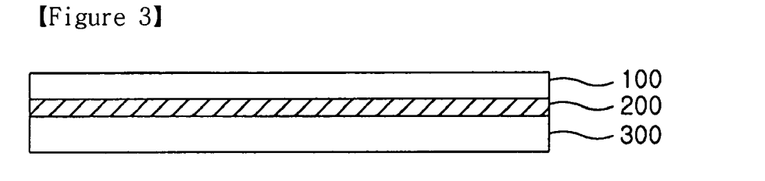

Meanwhile, the adhesive composition 202 may be diluted with a suitable organic solvent, and may be then applied on the flexible substrate 100. Accordingly, as shown in FIG. 2, an adhesive layer 200 is formed on the flexible substrate 100. Next, as shown in FIG. 3, a support 300 adheres to the adhesive layer 200 formed on the flexible substrate 100.

Subsequently, the flexible substrate 100 fixed on the support 300 through the adhesive layer 200 is placed on a conveyor belt and is then transported to a location for manufacturing a panel. In the process of manufacturing a panel, processes of forming a resist on the flexible substrate 100 and etching and cleaning are performed by directly using a conventional apparatus and processes for manufacturing a liquid crystal display device.

Figure 4:
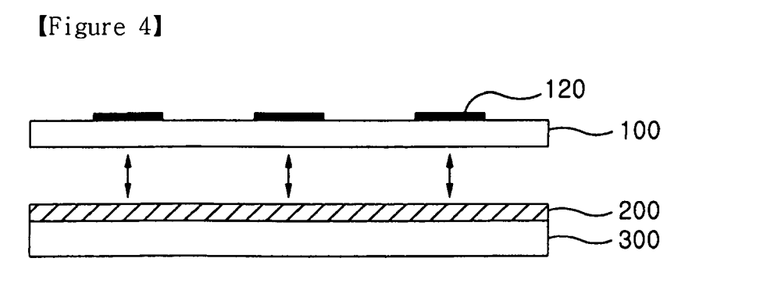

When the above processes are completed, as shown in FIG. 4, a pattern, such as transparent electrodes 120, is formed on the flexible substrate 100. Next, the flexible substrate 100 is separated from the support 300 after the last process.

In this case, the peel adhesive strength of the adhesive layer 200 to the support 300 is higher than that of the adhesive layer 200 to the flexible substrate 100. Accordingly, as shown in FIG. 4, when the flexible substrate 100 is separated from the support 300, only the flexible substrate 100 is separated from the support 300 with the adhesive layer 200 adhered to the support 300.

Meanwhile, it is obvious that the adhesive layer 200 may be formed by applying the adhesive composition 202 on the support 300, and then the support 300 is adhered to the flexible substrate 100, and it is preferred that the adhesive layer 200 be formed on the support 300 in advance.

Next, a process of transporting a flexible substrate according to a second embodiment of the present invention will be described in detail.

Figure 5:
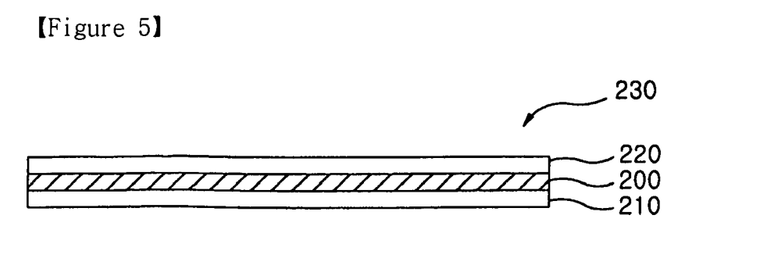
FIGS. 5 and 6 are sectional views showing adhesive sheets according to the present invention.
Figure 6:
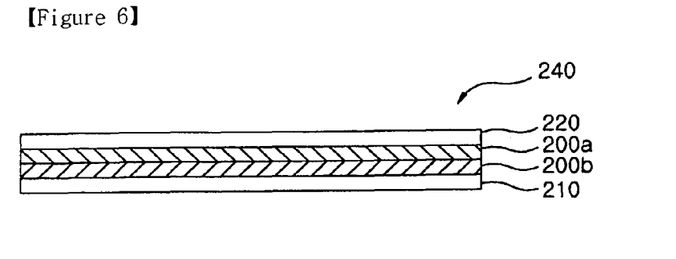

FIGS. 5 and 6 are sectional views showing adhesive sheets according to an embodiment of the present invention, and FIGS. 7 to 11 are sectional views showing a process of transporting a flexible substrate using the adhesive sheets in FIGS. 5 and 6 according to a second embodiment of the present invention.

According to the second embodiment of the present invention, an adhesive layer 200 is formed on a flexible substrate 100 in the form of an adhesive sheet 230. Referring to FIG. 5, the adhesive sheet 230 is formed by applying an adhesive composition for forming the adhesive layer 200 on a first release film 210 and then drying it. A second release film 220 is formed on the adhesive layer 200. The second release film 220 does not necessarily need to be provided.

The first and second release films 210 and 220 are easily separated from the adhesive layer 200 because they are treated with fluorine or silicon. Further, the surface tension of the first and second release films 210 and 220, which is measured through contact angle thereof, is from 10 to 30 mN/m (2 to 10 mN/m in polar part, 9 to 22 mN/m in dispersed part), preferably from 15 to 25 mN/m, and more preferably from 19 to 21 mN/m. Further, the surface roughness of the first and second release films 210 and 220, which is measured using a confocal laser scanning microscope, is preferably 0.2 μm or less, and more preferably 0.1 μm or less.

Referring to FIG. 6, the adhesive sheet 240 of the invention may be formed of a multi-layered structure having two or more adhesive layers 200a and 200b by applying two or more adhesive compositions having different adhesive strength. The two or more adhesive layers 200a and 200b are formed such that the peel adhesive strengths of the adhesive layers 200a and 200b to the support 300 are different from that of the adhesive layers 200a and 200b to the flexible substrate 100.

Hereinafter, for convenient explanations, a process of transporting a flexible substrate will be described in detail using an adhesive sheet in FIG. 5 of the above adhesive sheets.

Figure 7:
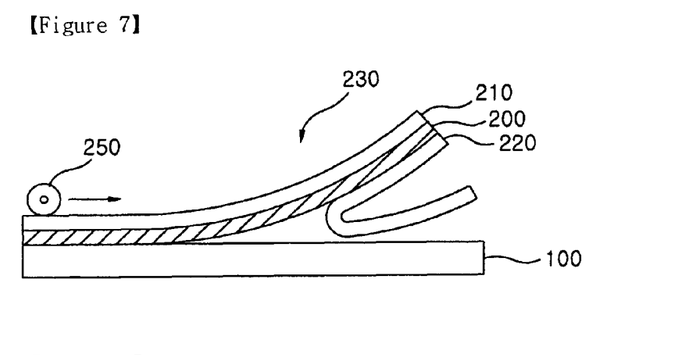
FIGS. 7 to 11 are sectional views showing a process of transporting a flexible substrate using the adhesive sheets in FIGS. 5 and 6 according to a second embodiment of the present invention.

Referring to FIG. 7, an adhesive sheet 230 is transferred to a flexible substrate 100. For this transfer process, a second release film 220 is peeled from the surface of the adhesive sheet 230, and then the adhesive sheet 230 is placed on the flexible substrate 100 such that the surface of the adhesive layer 200 comes into contact with the surface of the flexible substrate 100.

Figure 8:
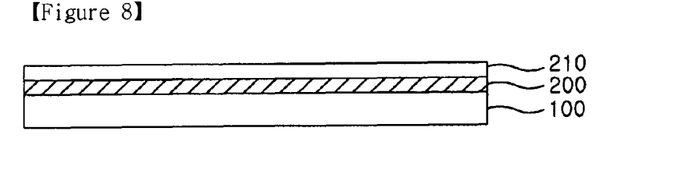
Figure 9:
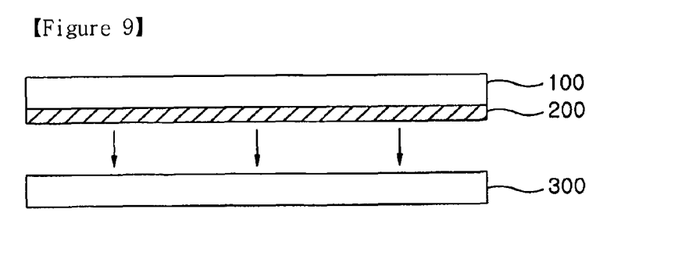

Next, a heated roller 250 is rolled on the placed adhesive sheet 230, and thus the placed adhesive sheet 230 is pressed on the flexible substrate 100 as shown in FIG. 8. Subsequently, as shown in FIG. 9, a first release film 210 is peeled and removed from the adhesive layer 200, and then the adhesive layer 200 is adhered to a support 300.

Figure 10:
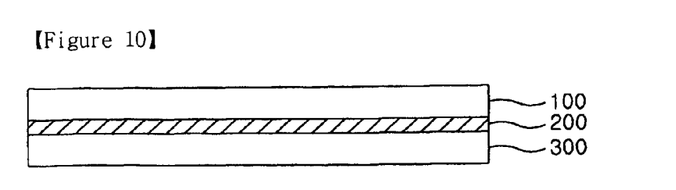

Subsequently, as shown in FIG. 10, the flexible substrate 100 fixed on the support 300 through the adhesive layer 200 is placed on a conveyor belt and is then transported to a location for a process of manufacturing a panel. In the process of manufacturing a panel, processes of forming a resist on the flexible substrate 100 and etching and cleaning the same are performed by using the conventional apparatus and processes for manufacturing a liquid crystal display device without change.

Figure 11:
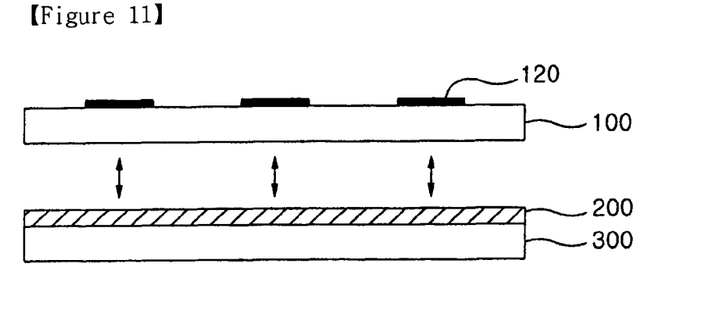

When the above processes are completed, as shown in FIG. 11, a pattern such as transparent electrodes 120 is formed on the flexible substrate 100. Next, the flexible substrate 100 is separated from the support 300 after the final process.

In this case, the peel adhesive strength of the adhesive layer 200 to the support 300 is higher than that of the adhesive layer 200 to the flexible substrate 100. Accordingly, as shown in FIG. 11, when the flexible substrate 100 is separated from the support 300, only the flexible substrate 100 is separated from the support 300 and the adhesive layer 200 continues to adhere to the support 300.

Meanwhile, it is obvious that the adhesive layer 200 may be formed by transferring the adhesive sheet 230 to the support 300, and then the support 300 may be adhered to the flexible substrate 100, and it is preferred that the adhesive layer 200 be formed on the support 300 in advance.

According to the first and second embodiments of the present invention, although the amount of the adhesive composition that is applied on the flexible substrate 100 or the support 300 is different depending on the material properties of the flexible substrate 100, it preferably ranges from 0.1 to 200 g/m$^2$, expressed as an amount of solid content. The thickness of the adhesive layer 200 is from 1 to 200 μm.

Further, the adhesive layer 200, formed on the flexible substrate 100 or the support 300 by applying the adhesive composition of the present invention thereon, may be heated at a temperature ranging from 80 to 200° C. for a time period ranging from 10 to 300 sec, so that a cured film is formed on the surface of the adhesive layer 200, thereby realizing desired peel adhesive strength and residual adhesive strength. When the curing temperature is 80° C. or less, a curing reaction, facilitated by a platinum catalyst for curing a silicon adhesive, does not occur. When the curing temperature is above 200° C., the flexible substrate 100 is damaged. Further, when the heating time is below 10 sec, the adhesive layer 200 is not sufficiently cured, and thus the adhesive layer 200 does not function as an adhesive, and weight variation due to residual materials is large. Accordingly, at the time of transporting the flexible substrate 100, bubbles are formed, so that the flexible substrate 100 detaches, thereby decreasing process stability. When the heating time is above 300 sec, the rate of formation of the adhesive layer is decreased.

The adhesive strength of the adhesive layer 200 is determined depending on the material properties of the support 300 or the flexible substrate 100, the thickness, surface shape, transport process conditions (heating temperature, washing condition), or peel workability. The adhesive strength can be adjusted by changing the shape of the surface of the adhesive layer 200, adjusting the polymerization degree and cross-linkage degree of the adhesive layer 200, adjusting the additives and curing agents, or changing the hardness. The peel adhesive strength of the adhesive layer 200 to the support or the flexible substrate preferably ranges from 10 to 300 gf/25 mm. When the peel adhesive strength is below 10 gf/25 mm, the ease with which the flexible substrate 100 is peeled from the adhesive layer 200 is improved, but the flexible substrate 100 is not stably transported because bubbles are formed on the adhesive face of the flexible substrate 100, a washing liquid infiltrates into the adhesive face, and the flexible substrate 100 is peeled from the support 300 depending on the transport process conditions (heating temperature, washing conditions). When the peel adhesive strength is above 300 gf/25 mm, process stability is excellent because the flexible substrate 100 is fixed to the support 300, but the flexible substrate 100 is easily cracked and deformed, or the adhesive layer 200 adheres to the flexible substrate 100 at the time of peeling, because the flexible substrate 100 is not easily peeled from the support 300 after processes are completed.

According to the first or second embodiment of the present invention, the flexible substrate 100 is separated from the support 300 after the process of transporting the flexible substrate 100 is completed, and then the adhesive layer 200 remaining on the support 300 must be removed in order to reuse the support 300.

FIGS. 12 to 15 are sectional views showing a process of removing an adhesive layer from a support after the flexible substrate and support are separated according to an embodiment of the present invention.

Figure 12:
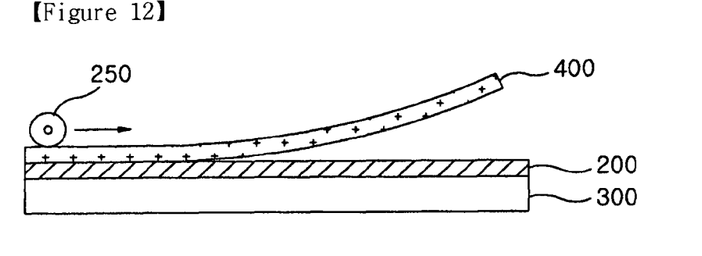
FIGS. 12 to 15 are sectional views showing a process of removing an adhesive layer from a support after the flexible substrate and the support have been separated from each other according to the preferable embodiment of the present invention.
Figure 13:
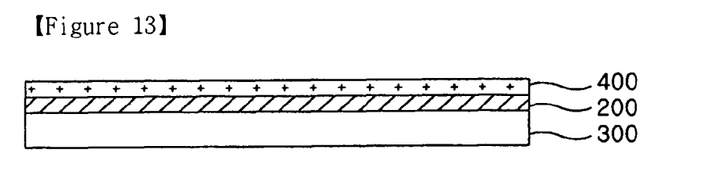
Figure 14:
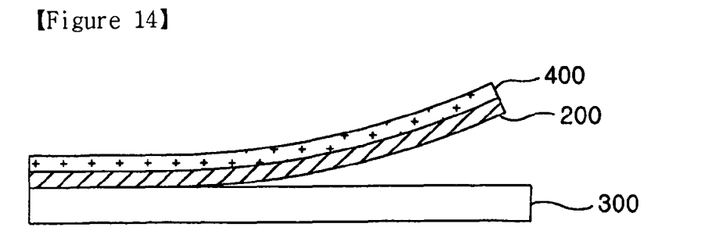
Figure 15:
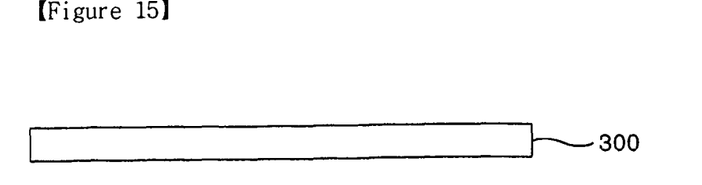

Referring to FIG. 12, an adhesive tape 400 is transferred to a support 300 on which an adhesive layer 200 has been applied. That is, the adhesive tape 400 is placed on the surface of the adhesive layer 200, and then, as shown in FIG. 13, the adhesive tape 400 is pressed onto the adhesive layer 200 by moving a heated roller 250 on the adhesive tape 400. It is preferred that an adhesive having an adhesive strength of 500 gf/25 mm or more is used as the adhesive tape 400. Next, when the adhesive tape 400 is removed, as shown in FIG. 14, the adhesive layer 200 is also removed. That is, both the adhesive tape 400 and the adhesive layer 200 are removed from the support 300 because the adhesive strength of the adhesive tape 400 to the adhesive layer 200 is higher than that of the adhesive layer 200 to the support 300. Accordingly, as shown in FIG. 14, a support 300 from which the adhesive layer 200 has been removed can be obtained.

Meanwhile, it is obvious that the adhesive layer 200 may be removed from the support 300 using an organic solvent such as acetone or toluene, rather than by the above method.

Hereinafter, the present invention will be described based on Examples and Comparative Examples. However, the present invention is not limited to the following Examples. The term "Parts" used in the following Examples means "parts by weight", and the term "characteristic value" is referred to as "measurement value" measured by the following test methods.

Examples

*95<Preparation and Combination of Silicon Adhesive>

Polydimethylsiloxane containing an alkenyl group, wherein molecular chain ends of the Polydimethylsiloxane are blocked by a vinyl group, the Polydimethylsiloxane includes 0.15 mole % of methylvinylsiloxane units, and the Polydimethylsiloxane has a viscosity of 2200 mPas when it is dissolved with toluene to be 30% of a solid content; a toluene solution of 60% of polyorganosiloxane including $Me_3SiO_{1/2}$ units and $SiO_2$ units ($Me_3SiO_{1/2}$ units/$SiO_2$ units=0.85); and $Me_3SiO$—$[MeHSiO]_{40}SiMe_3$, serving as a crosslinking agent, were mixed. Subsequently, toluene, γ-glycidoxypropyltrimethoxysilane, serving as a silane coupling agent, and platinum group based chloroplatinic acid were added to the composition 100 parts by weight, and finally a silicon adhesive composition having 30% of a solid content was prepared. The component and content of the prepared composition is given in Table 1.

The prepared composition was diluted to a suitable concentration and uniformly mixed, was applied to a PET release paper treated with fluorine, and was then dried at a temperature of 140□ for 3 minutes, thereby obtaining an uniform adhesive layer having a size of 30×25 $cm^2$ and a thickness of 25 μm.

<Substrate Manufacturing Process>

After a glass substrate having a thickness of 0.7 t is attached to one surface of the obtained adhesive layer and a PEN having a thickness of 200 μm is attached to the opposite surface thereof, physical properties necessary for an adhesive for transporting a substrate was measured.

TABLE 1

| Weight part | Alkenyl (A) | MQ resin (B) | Crosslinking agent (C) | Platinum catalyst (D) | Silane coupling agent | toluene |
|---|---|---|---|---|---|---|
| Example 1 | 48 | 52 | 2.2 | 2.2 | 4.1 | 222 |
| Example 2 | 52 | 48 | 2.2 | 2.2 | 4.1 | 222 |
| Example 3 | 56.4 | 43.6 | 2.2 | 2.2 | 4.1 | 222 |
| Example 4 | 61.5 | 38.5 | 2.2 | 2.2 | 4.1 | 222 |
| Example 5 | 67.2 | 32.8 | 2.2 | 2.2 | 4.1 | 222 |
| Com. example 1 | 41 | 59 | 2.2 | 2.2 | 4.1 | 222 |
| Com. example 2 | 44.3 | 55.7 | 2.2 | 2.2 | 4.1 | 222 |
| Com. example 3 | 73.6 | 26.4 | 2.2 | 2.2 | 4.1 | 222 |
| Com. example 4 | 100 | 0 | 2.2 | 2.2 | 4.1 | 222 |

The weight ratio of the platinum catalyst to the sum of the components (A) and (B) is about 2000 ppm by platium weight, and the mole ratio of the alkenyl to the SiH is about from 1:0.48 to 1:1.08.

<Evaluation of Silicon Adhesive Characteristics>

1) Light Transmissivity

The light transmissivity of the silicon adhesive was evaluated by measuring the haze of the silicon adhesive. First, haze measurement samples were cut to a size of 40×70 $mm^2$, and then diffusion transmissivity Td and total transmissivity Ti were measured using an integral type transmissivity measuring device based on JIS K7150 and ASTM D 1003-95. The term "haze" is defined as Td, expressed as a percentage of Ti. The measurement samples were cured at a temperature of 200☐ for 24 hours, and then the haze was measured in the same way. The change of transmissivity due to the high temperature process was evaluated by comparing and evaluating haze characteristics before and after curing the measurement samples.

2) Peel Adhesive Strength

The adhesive applied to a fluorine release paper was cut to a size of 1 inch×6 inches, was attached to a piece of nonalkaline glass having a thickness of 0.7 mm or PEN having a thickness of 125 μm, was heated at a temperature of 200° C. for 1 hour, and was left at room temperature for 1 hour, and then the peel adhesive strength of the adhesive was measured. In this case, the peel adhesive strength was measured at a peeling rate of 300 mm/min and a peel angle of 180° using a tension testing device.

3) Chemical Resistance

First, a silicon adhesive was attached to one surface of a glass substrate, and then PEN was attached to the other surface of the glass substrate. The glass substrate, to which the silicon adhesive and the PEN were attached, was put into an aluminum etching solution, an ITO etching solution and a photographic liquid, and then whether or not the adhesive was dissolved therein was observed. Further, the glass substrate, to which the silicon adhesive and the PEN were attached, was put into a stripper solution, and then the chemical resistance thereof was observed. The aluminum etching solution was an aqueous solution composed of phosphoric acid (6%), acetic acid (9%) and nitric acid (4.5%), and the ITO etching solution is an aqueous solution composed of 5% of oxalic acid, and the photographic liquid was an aqueous solution composed of 2.4% of TMAOH (Tetramethyl Ammonium Hydroxide). Further, the stripper solution was composed of 10% of MEA (Mono Ethanol Amine), 30% of MNP (N-methyl Pyrrolidone) and 60% of BDG (Butyl-Di-Glycol).

4) Bubble Generation

First, a silicon adhesive was attached to one surface of a glass substrate, PEN was attached to the other surface of the glass substrate, and then the glass substrate to which the silicon adhesive and the PEN were attached was cured in an oven at a temperature of 200° C. for 1 hour. The difference in the number of bubbles generated before and after heat treatment using the oven was observed.

5) Detachability of a Substrate to a Support

After the heat resistance test related to bubble generation, detachability of a substrate to a support was measured by pulling the flexible substrate by hands. Particularly, it was observed whether a silicon adhesive is transferred to the substrate.

6) Detachability of a Silicon Adhesive to a Support

An adhesive tape having an adhesive strength adhesive strength 5 mm was laminated on a silicon adhesive, and then whether the silicon adhesive detached was determined by pulling the adhesive tape with the hands, and whether the silicon adhesive detached from the glass substrate, which functioned as a support, was observed.

The above measured results are given in Table 2.

TABLE 2

|  | Peel adhesive strength | | Chemical resistance | Bubble | Transmissivity | Detachability of substrate | Detachability of support |
| --- | --- | --- | --- | --- | --- | --- | --- |
|  | Glass | PEN | | | | | |
| Example 1 | 135 | 164 | good | not exist | 0.1 | 0 | 0 |
| Example 2 | 108 | 104 | good | not exist | 0.1 | 0 | 0 |
| Example 3 | 76 | 31 | good | not exist | 0.1 | 0 | 0 |
| Example 4 | 58 | 21 | good | not exist | 0.1 | 0 | 0 |
| Example 5 | 39 | 14 | good | not exist | 0.1 | 0 | 0 |
| Com. Example 1 | 967 | 773 | good | not exist | 0.1 | X | X |
| Com. Example 2 | 624 | 312 | good | not exist | 0.1 | X | X |
| Com. Example 3 | 9 | 9.4 | good | exist | 0.1 | Δ | 0 |
| Com. Example 4 | 0.9 | 6.2 | good | exist | 0.1 | not attached | not attached |

Δ: detahed by bubble during a process

INDUSTRIAL APPLICABILITY

The silicon adhesive composition according to the present invention has heat resistance, chemical resistance, close adhesion to base material, and transparency, and enables easy substrate detachability, all of which are necessary for an adhesive for transporting a flexible substrate. Flexible displays using a flexible substrate such as a plastic substrate can be manufactured using a process and apparatus for manufacturing a liquid crystal display device using a glass substrate and the silicon adhesive composition of the present invention.

The invention claimed is:

1. A silicon adhesive composition for transporting a flexible substrate, comprising:
(A) 42 to 70 parts by weight of a polydiorganosiloxane containing an alkenyl group;
(B) 55 to 28 parts by weight of a polyorganosiloxane copolymer including $R^1{}_3SiO_{1/2}$ units and $SiO_2$ units, wherein $R^1$ is a hydroxy group or a monovalent hydrocarbon group of 1 to 12 carbon atoms;
(C) a polyorganosiloxane containing an SiH group, wherein the molar ratio of the SiH group of component (C) to the alkenyl group of component (A) is from 0.5 to 20; and (D) a platinum group catalytic compound, wherein the weight ratio of a metal component of the compound to the sum of components (A) and (B) is from 1 to 5000 ppm by weight, wherein the weight ratio of component (A) to component (B) is from 1:0.4 to 1:1.3, and the peel adhesive strength of the composition to a flexible substrate is from 10 to 200 g/25 mm, and wherein the flexible substrate is one or more selected from the group consisting of metal foil, polyester, polytetrafluoroethylene, polyimide, polyphenylene sulfide, polyamide, polycarbonate, polystyrene, polypropylene, polyethylene, polyvinylchloride, polyethersulfone and polyethylenenaphthalene, wherein the composition further comprises a silane-based coupling agent of 3 to 10 parts by weight based on 100 parts by weight of component (A).

2. The composition of claim 1, wherein the weight ratio of component (A) to component (B) is from 1:0.4 to 1:1.

3. The composition of claim 1, wherein the weight ratio of component (A) to component (B) is from 1:0.5 to 1:0.95.

4. The composition of claim 1, wherein the polydiorganosiloxane (A) containing an alkenyl group has the following Formula (1):

(1), wherein $R^2$ is a monovalent hydrocarbon group of 1 to 12 carbon atoms, not including an aliphatic unsaturated linkage, Xs may be identical or different, and each is an organic group containing an alkenyl group of 1 to 12 carbon atoms or a hydroxy group, provided that every X is not a hydroxy group, m is a number greater than or equal to 0, and n is a number greater than or equal to 100, a is an integer number ranging from 0 to 3 where X represents an alkenyl group, a is 1 where X represents a hydroxy group, and a and m are not both 0.

5. The composition of claim 1, wherein the molar ratio of $R^1_3SiO_{1/2}$ units to $SiO_2$ units in the polyorganosiloxane copolymer (B) is from 0.6 to 1.7.

6. The composition of claim 1, wherein the straight-chain, branched-chain or cyclic polyorganosiloxane (C) containing an SiH group has the following Formula (2) or Formula (3):

(2)

(3)

wherein each $R^3$ and $R^4$ is independently a monovalent hydrocarbon group of 1 to 12 carbon atoms, b is 0 or 1, p and q are arbitrary integer numbers, s is an integer number greater than or equal to 2, t is an integer number greater than or equal to 0, and s+t≧3, and each p+q and s+t has value such that the viscosity of the polyorganosiloxane according to Formula (2) or the Formula (3), respectively, is from 1 to 5000 mPa·s at 25° C.

7. The composition of claim 1, wherein the platinum group catalytic compound (D) is one or more selected from the group consisting of platinum black, chloroplatinic acid, chloroplatinic acid-olefin complex, chloroplatinic acid-alcohol coordination compound, rhodium, and rhodium-olefin complex.

8. The composition of claim 1, wherein the composition further comprises an organic solvent of 50 to 200 parts by weight per 100 parts by weight of components (A) and (B).

9. An adhesive sheet comprising an adhesive layer containing the silicon adhesive composition according to claim 1.

10. The adhesive sheet of claim 9, wherein the adhesive layer is formed on a release film.

11. The adhesive sheet of claim 10, wherein a surface tension of the release film is from 10 to 30 mN/m, and a surface roughness thereof is 0.2 μm or less.

12. The adhesive sheet of claim 9, wherein the adhesive layer includes a multi-layered structure coated with two or more adhesive compositions having different adhesive strength.

13. A method of transporting a flexible substrate, comprising the steps of:
(a) forming an adhesive layer on a flexible substrate or on a support;
(b) attaching the flexible substrate and the support, one of which is provided with the adhesive layer, to each other and then transporting the flexible substrate and the support; and
(c) separating the flexible substrate from the adhesive layer and the support, wherein the adhesive layer comprises the silicon adhesive composition according to claim 1.

14. The method of claim 13, further comprising the step of heating the adhesive layer at a temperature of 80 to 200° C. for 10 to 300 sec between the step (a) and the step (b).

15. The method of claim 13, wherein the peel adhesive strength of the adhesive layer to the support is higher than that of the adhesive layer to the flexible substrate.

16. The method of claim 13, further comprising the step of (f) removing the adhesive layer from the support coated with the adhesive layer using an organic solvent after the step (c).

17. The method of claim 13, further comprising the steps of (g) transferring an adhesive tape to an upper portion of the support coated with the residual adhesive layer, and (h) separating the adhesive layer and the adhesive tape from the support after the step (c).

18. The method of claim 17, wherein adhesive strength of the adhesive tape is 500 g/25 mm or more.

* * * * *